US008810106B2

(12) United States Patent
Ballandras et al.

(10) Patent No.: US 8,810,106 B2
(45) Date of Patent: Aug. 19, 2014

(54) HBAR RESONATOR WITH A HIGH LEVEL OF INTEGRATION

(75) Inventors: Sylvain Ballandras, Besancon (FR); Dorian Gachon, Besancon (FR)

(73) Assignees: Centre National de la Recherche Scientifique (C.N.R.S.), Paris (FR); Universite de Franche Comte, Besancon (FR)

( * ) Notice: Subject to any disclaimer, the term of this patent is extended or adjusted under 35 U.S.C. 154(b) by 848 days.

(21) Appl. No.: 12/995,572

(22) PCT Filed: May 29, 2009

(86) PCT No.: PCT/FR2009/051023
§ 371 (c)(1),
(2), (4) Date: Aug. 10, 2011

(87) PCT Pub. No.: WO2009/156667
PCT Pub. Date: Dec. 30, 2009

(65) Prior Publication Data
US 2011/0210802 A1    Sep. 1, 2011

(30) Foreign Application Priority Data

Jun. 4, 2008   (FR) ...................................... 08 53690

(51) Int. Cl.
*H03H 9/15*   (2006.01)
(52) U.S. Cl.
USPC .......................................... 310/320; 310/357
(58) Field of Classification Search
CPC ....... H03H 9/177; H03H 3/02; H03H 9/0207; H01L 41/45; H01L 41/22
USPC ................................................. 310/320, 357
See application file for complete search history.

(56) References Cited

U.S. PATENT DOCUMENTS 3,401,275 A * 9/1968 Berlincourt et al. .......... 310/320
7,609,132 B2 * 10/2009 Ballandras et al. ........... 333/187

(Continued)

OTHER PUBLICATIONS

Gachon et al., "LiNbO3-LiNbO3 High Overtone Bulk Acoustic Resonator Exhibiting High Q.f Product," IEEE Ultrasonics Symposium, pp. 1417-1420 (2007).

(Continued)

*Primary Examiner* — Thomas Dougherty
*Assistant Examiner* — Bryan Gordon
(74) *Attorney, Agent, or Firm* — McDermott Will & Emery LLP

(57) ABSTRACT

The invention relates to a resonator of the high bulk acoustic resonator HBAR type, for operating at a pre-determined working frequency, comprising: a piezoelectric transducer (6), an acoustic substrate (10), a counter-electrode (8) formed by a metal layer adhering to a first face of the transducer (6) and a face of the acoustic substrate (10), and an electrode (4) arranged on a second face of the transducer (6) facing away from the first face of the transducer (6) and the substrate (10). Said resonator is characterized in that the relative arrangement of the transducer (6) and the substrate (10) is such that the polarization direction P of the shearing mode of the transducer (6) and the direction of polarization P of the at least one shearing mode of the substrate (10) corresponding to the second cutting angle θ2 are aligned, and the second cutting angle θ2 of the substrate (10) is such that the temperature coefficient of the frequency of the corresponding first order CTFB1 is a local extremum with an absolute value of less than 20 ppm·K$^{-1}$, and the variation of CTFB1 from said value of Θ2 is slight with an absolute value of less than 2 ppm·K$^{-1}$/degree.

15 Claims, 8 Drawing Sheets

(56) References Cited

U.S. PATENT DOCUMENTS

| | | | |
|---|---|---|---|
| 2004/0129958 A1* | 7/2004 | Koh et al. | 257/275 |
| 2004/0159153 A1* | 8/2004 | Dilz, Jr. | 73/489 |
| 2006/0186759 A1* | 8/2006 | Kim et al. | 310/320 |
| 2007/0035207 A1* | 2/2007 | Kawamura et al. | 310/324 |
| 2007/0040473 A1* | 2/2007 | Ballandras et al. | 310/320 |
| 2011/0210802 A1* | 9/2011 | Ballandras et al. | 331/158 |

OTHER PUBLICATIONS

Masson et al., "High Overtone Bulk Acoustic Resonators build using Aluminum Nitride thin films deposited onto AT-cut quartz plates," IEEE Symposium, pp. 835-838 (2006).

PCT/FR2009/051023: International Search Report and Written Opinion, 7 pages (Feb. 11, 2009).

* cited by examiner

HBAR RESONATOR WITH A HIGH LEVEL OF INTEGRATION

RELATED APPLICATIONS

This application is the U.S. National Stage of International Application No. PCT/FR2009/051023, filed May 29, 2009, which claims the benefit of French Application Serial No. 0853690, filed Jun. 4, 2008.

The invention concerns a resonator of the high bulk acoustic resonator (HBAR) type that is temperature stable and has a high level of integration, a corresponding production method, an oscillator and a filter including at least one such resonator.

Mechanical resonators, i.e. manufactured by mechanical machining of metal, with a base of vacuum electromagnetic cavities defined by metal walls, are commonly used for the temperature stabilization of electric oscillators, as well as for a number of signal processing applications (high selectivity filtering, narrow band detection, encoding, etc.) with a base of passive components in the frequency range from 2 GHz to 20 GHz, in particular in the field of spatial activities.

These devices are optimized for their particular applications while seeking to maximize their quality or coupling coefficients, for example.

While the adjustment of the mechanical resonators offering a good compromise between strong electrical coupling, high quality coefficient and thermal stability remains delicate, the major drawback of such devices lies in their high mass and bulk.

Microstrips constitute an important step in the integration of the passive components used for band filtering in the 2 GHz to 20 GHz frequency range, at the expense of mastery of the thermal drifts and at a lower resonance quality. The components are made by lithography of metal tracks on dielectric substrates and thereby allow a notable decrease in dimensions. Nevertheless, these objects continue to have dimensions of several centimeters, even if they tend to decrease as the frequency rises. For the 2 GHz to 20 GHz frequency range, they are still larger than a centimeter.

The technical problem is to improve the level of integration in mass and volume of high frequency electric resonators in the 2 to 20 GHz frequency range having high temperature stability.

To that end, the invention concerns a resonator of the high bulk acoustic resonator (HBAR) type, for operating at a predetermined working frequency, comprising:

a piezoelectric transducer formed by a layer with a first thickness of a first material oriented along an angle $\phi$ defined by the nomenclature (YXw)/$\phi$ of the IEEE Std-176 (1949 revision) standard equal to zero, cut along a first cutting angle $\theta 1$ defined by the nomenclature (YX1)/$\theta$ of the IEEE Std-176 (1949 revision) standard, such that the electroacoustic coupling of the shear waves within that material alone is greater than 5%, the transducer having a temperature coefficient of the frequency CTFA as a function of the first cutting angle $\theta 1$, an acoustic substrate formed by a second layer with a second thickness of a second material having a working frequency acoustic quality coefficient product at least equal to $5.10^{12}$, oriented along an angle $\phi$ defined by the nomenclature (YXw)/$\phi$ of the IEEE Std-176 (1949 revision) standard equal to zero, cut along a second cutting angle $\theta 2$ defined by the nomenclature (YX1)/$\theta$ of the IEEE Std-176 (1949 revision) standard, having at least one polarization direction $\vec{P}_{B1}$ corresponding to a first shearing mode of vibration, the acoustic substrate having a temperature coefficient of the frequency of the first order CTFB1 corresponding to the at least one shearing mode and depending on the second cutting angle $\theta 2$, a counter-electrode formed by a layer of metal adhering to a first face of the transducer and a face of the acoustic substrate, and an electrode arranged on a second face of the transducer facing away from the first face of the transducer and the substrate, characterized in that the relative arrangement of the transducer and the substrate is such that the direction of polarization $\vec{P}_A$ of the shearing mode of the transducer and the polarization direction $\vec{P}_{B1}$ of the at least one shearing mode of the substrate corresponding to the second cutting angle $\theta 2$ are aligned, and the second cutting angle $\theta 2$ of the substrate is such that the temperature coefficient of the frequency of the corresponding first order CTFB1 is a local extremum with an absolute value of less than 20 ppm·K$^{-1}$ and the variation of CTFB1 around that value of $\theta 2$ is slight with an absolute value of less than 2 ppm·K$^{-1}$/degree. According to specific embodiments, the HBAR type resonator includes one or several of the following features:

the temperature coefficient of the frequency of the first order CTF1 of the resonator is substantially equal to the temperature coefficient of the frequency of the first order CTFB1 for HBAR resonator modes not corresponding to the fundamental or the odd harmonics of the resonance of the transducer alone when the ratio Re of the first thickness over the second thickness is less than 5%;

the value of the temperature coefficient of the frequency of the first order CTF1 of the resonator is equal to the temperature coefficient of the frequency of the first order CTFB1 corrected by an additional corrective term for HBAR resonator modes not corresponding to the fundamental or to the odd harmonics of the resonance of the transducer alone when the ratio Re of the first thickness over the second thickness is less than 5%, the corrective term being written $\alpha \cdot n$ with n the whole number designating the harmonic order of the resonance mode of the resonator and $\alpha$ a coefficient depending on the ratio of the thicknesses Re with decreasing absolute values as a function of Re;

the material of the transducer is included in the group of materials made up of aluminum nitride (AlN), zinc oxide (ZnO), lithium niobate (LiNbO$_3$), lithium tantalate (LiTaO$_3$) and potassium niobate;

the material of the transducer is preferably included in the group of materials made up of lithium niobate (LiNbO$_3$) and lithium tantalate (LiTaO$_3$);

the material of the acoustic substrate is included in the group of materials made up of quartz, potassium niobate, gallium orthophosphate (GaPO$_4$), lithium tetraborate (LiB$_4$O$_7$), langasite (La$_3$Ga$_5$SiO$_{14}$), langatate and langanite;

the material of the acoustic substrate is quartz;

the counter-electrode is a thermo-compressible metal;

the counter-electrode is made up of gold or copper or indium;

the geometric dimensions of the resonator are adapted for a resonance frequency of a frequency band included in the frequency range from 50 MHz to 20 GHz;

the material of the acoustic substrate is quartz, the second cutting angle $\theta 2$ of the substrate is equal to $-32$ degrees, and the polarization direction $\vec{P}_{B1}$ corresponds to the slow shearing mode of the quartz for a value of θ2 equal to −32 degrees; and the material of the transducer of potassium niobate and the coefficient α is equal to $-3 \cdot 10^{-7}, -1, 5 \cdot 10^{-7}, -3, 75 \cdot 10^{-8}, -1, 875 \cdot 10^{-8}$, respectively, for a respective ratio of the thicknesses equal to 5%, 2%, 1%, 0.5%.

The invention also concerns a method for manufacturing a HBAR resonator comprising the following steps:

providing a piezoelectric transducer made up of a layer of a first thickness of a first material oriented along an angle φ defined by the nomenclature (YXw)/φ of the IEEE Std-176 (1949 revision) standard equal to zero, cut along a first cutting angle θ1 defined by the nomenclature (YX1)/θ of the IEEE Std-176 (1949 revision) standard, such that the electroacoustic coupling of the shear waves within that material alone is greater than 5%, the transducer having a temperature coefficient of the frequency CTFA as a function of the first cutting angle θ1, and providing an acoustic substrate formed by a first layer with a second thickness of a second material having a working frequency acoustic quality coefficient product at least equal to $5.10^{12}$, oriented along an angle φ defined by the nomenclature (YXw)/φ of the IEEE Std-176 (1949 revision) standard equal to zero, cut along a second cutting angle θ2 defined by the nomenclature (YX1)/θ of the IEEE Std-176 (1949 revision) standard, having a polarization direction $\vec{P}_{B1}$ corresponding to a first shearing mode of vibration, the acoustic substrate having a temperature coefficient of the frequency of the first order CTFB1 corresponding to the at least one shearing mode and depending on the second cutting angle θ2, metalizing one face of the substrate and a first face of the transducer using a thermo-compressible metal, assembling the transducer and the substrate, adhering, by compression, the respective faces of the substrate and the transducer metalized in the step, metalizing an electrode on a second face of the transducer, characterized in that during the assembly step, the transducer is arranged in relation to the substrate such that the relative arrangement of the transducer and the substrate is such that the polarization direction $\vec{P}_A$ of the shearing mode of the transducer and the polarization direction $\vec{P}_{B1}$ of the at least one shearing mode of the substrate corresponding to the second cutting angle θ2 are aligned, and in that in the step for providing the substrate, the second cutting angle θ2 of the substrate is chosen such that the temperature coefficient of the frequency of the first corresponding order CTFB1 is a local extremum with an absolute value of less than 20 ppm·K$^{-1}$ and the variation of CTFB1 from said value of θ2 is slight with an absolute value of less than 2 ppm·K$^{-1}$/degree.

The invention also relates to a homodyne oscillator comprising a HBAR resonator as defined above.

The invention also relates to a high reject filter comprising HBAR resonator-based cells as defined above.

The invention will be better understood upon reading the following description of one embodiment, provided solely as an example and done in reference to the drawings, in which:

FIG. 1 is a perspective view of a HBAR resonator according to the invention,

FIG. 2 is a transverse cross-sectional view of the resonator of FIG. 2 along line II-II, FIG. 3 is a view of the illustration of the first cutting angle θ1 of the crystal forming the piezoelectric transducer, FIG. 4 is a view of the evolution of the phase speed of the body waves of a lithium niobate crystal as a function of the cutting angle θ1, this family of crystalline orientations generally being called "single rotation cuts,"

FIG. 5 is a view of the evolution of the coupling coefficients of these same waves for the lithium niobate as a function of the angle θ1, FIG. 6 is a planar illustration related to the plate of the transducer of the polarization of the shear waves, FIG. 7 is a view of the illustration of the second cutting angle θ2 of the crystal forming the acoustic substrate, FIG. 8 is a planar illustration related to the plate of the acoustic substrate of the polarization of the shear waves of the acoustic substrate, FIG. 9 is a variation graph of the temperature coefficients of the frequency for the shearing modes of the quartz as a function of the cutting angle θ2.

Figure 1:
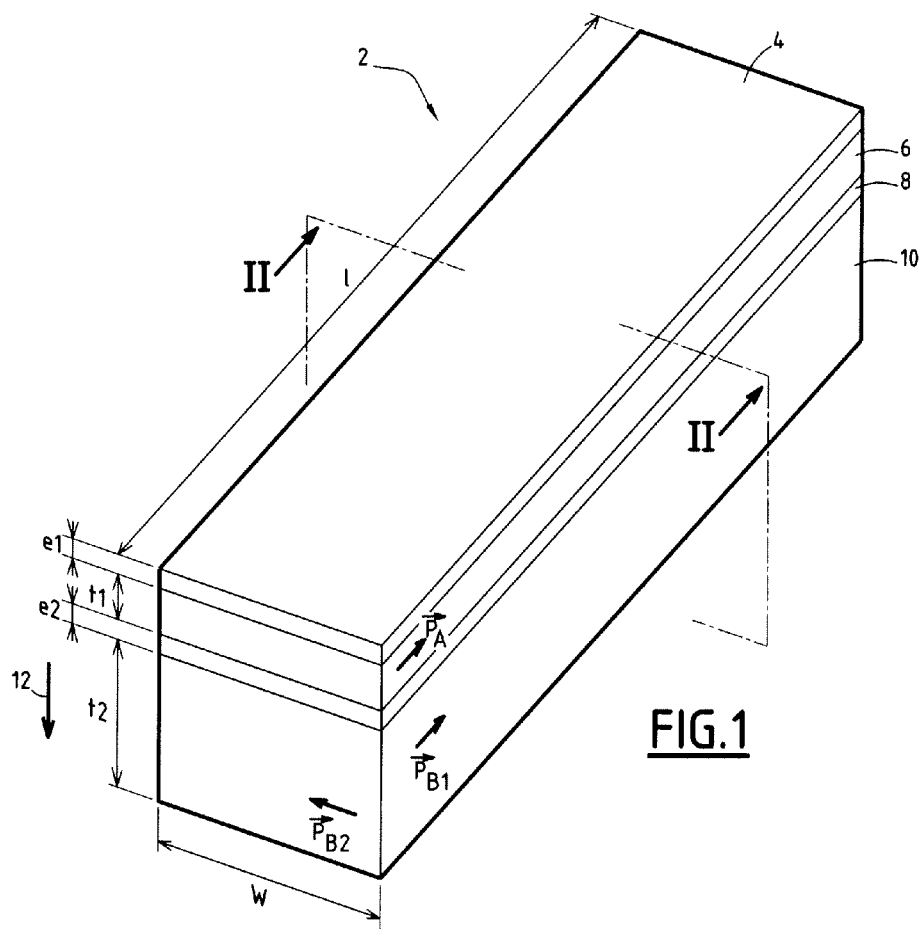
FIGS. 1 and 2 illustrate an embodiment of a high bulk acoustic resonator 2 according to the invention.

The resonator 2 comprises a stack of successive layers including:

an upper electrode 4 made of aluminum with a thickness $e_1$, a piezoelectric transducer 6 made up of a first material, here lithium niobate (LiNbO3), in monocrystalline form having a first thickness $t_1$, an embedded counter-electrode 8, made of gold, with a thickness $e_2$, an acoustic substrate 10 made up of a second material, here quartz, in monocrystalline form having a second thickness $t_2$.

All of the layers 4, 6, 8 and 10 in FIG. 1 have the same length L and width W, the length being clearly larger than the width W and the different layer thicknesses $e_1$, $t_1$, $e_2$ and $t_2$.

To simplify FIG. 1, the electrodes 4, 8 are shown with surfaces equal to those of the piezoelectric transducer 6.

In practice, the electrodes 4, 8 have smaller surfaces than those of the piezoelectric layer 6, and the upper electrode 4 has a surface smaller than or equal to that of the embedded counter-electrode 8.

In the manufacturing method including an embedded layer serving as adhesion layer, the counter-electrode 8 naturally has a larger surface than that of the upper electrode 4 manufactured by a lithography and metal layer deposition technique.

The surfaces of the electrodes 4, 8 are positioned facing each other, parallel to each other, the respective zones facing the surfaces being maximal, with the edges as parallel as possible. Ideally, the surfaces of the electrodes 4, 8 are perfectly superimposed.

Figure 2:
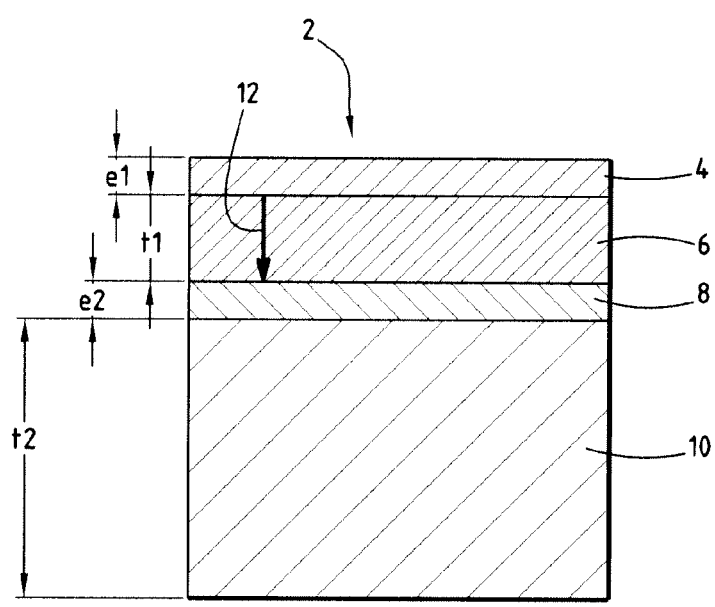

Thus, the excitation of the waves is assumed to correspond to a so-called plane-plane configuration of the resonator, for which the waves are excited by the very thin electrodes 4, 8 deposited on the surfaces opposite the piezoelectric transducer 6, in the direction illustrated by arrow 12 according to FIG. 2 of propagation of the shear waves in the transducer 6.

The piezoelectric transducer 6 has an excited shearing mode according to a polarization oriented along the length 1 of the resonator illustrated by the vector $\vec{P}_A$.

The acoustic substrate 10 has two shearing modes, a first so-called slow mode and a second so-called fast mode.

The so-called fast shear waves and the so-called slow shear waves are defined as orthogonal polarization shear waves, the so-called fast waves having a higher phase velocity than the so-called slow waves.

In FIG. 1, the polarization vector $\vec{P}_A$ of the excitation corresponding to the shearing mode of the transducer 6 is aligned with a polarization vector referenced $\vec{P}_{B1}$ corresponding to the slow shearing mode of the acoustic substrate.

A polarization vector corresponding to the excitation of the fast shearing mode is illustrated in FIG. 1 by $\vec{P}_{B2}$, orthogonal to $\vec{P}_{B1}$ and contained in an extension plane of the substrate 10.

The counter-electrode 8 inserted between the transducer 6 and the substrate 10 is also used for adhesion to the structure of the resonator 2.

The layer of lithium niobate (LiNbO3) making up the transducer 6 is a plate cut out along a first cutting angle $\theta 1$ in a raw monocrystalline material forming a wafer.

The layer of quartz making up the acoustic substrate 10 is a plate cut out along a second cutting angle $\theta 2$ in a raw monocrystalline quartz wafer.

Figure 3:
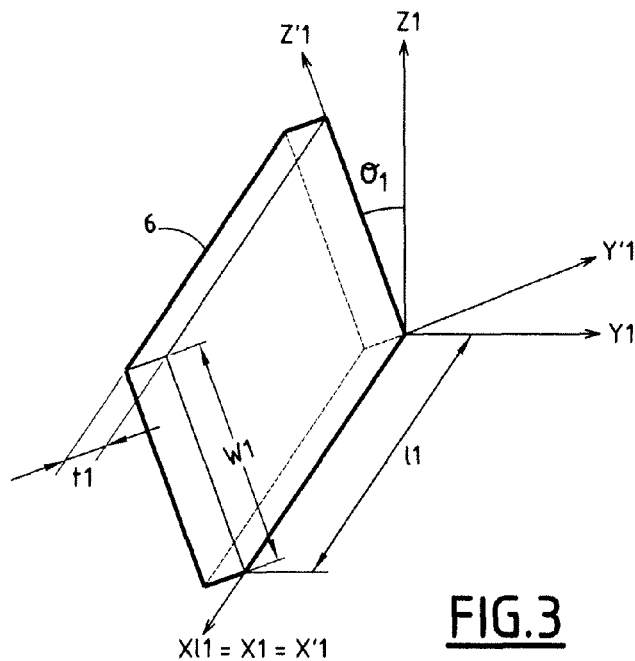

According to FIG. 3, the lithium niobate plate 6 is cut out along a first cutting angle $\theta 1$ from the material of the wafer not illustrated but referenced by its crystallographic axes $X_1$, $Y_1$, $Z_1$, axis $Z_1$ being the longitudinal axis of the wafer and the crystallographic axes $X_1$, $Y_1$ being predetermined during manufacture of the monocrystal.

The angle $\theta 1$ here is defined in the IEEE Std-176 (1949 revision) standard as the angle $\theta 1$ of a single rotation cutting around the crystallographic axis X1, the cut being noted $(Y_1 X_{11})$ 101 in the IEEE standard, $X_{11}$ being the axis aligned on the straight lower edge with thickness $t_1$ with length 11 according to the illustration of FIG. 3.

The reference frame related to the cut out plate 6 is shown by the three axes $X'_1$, $Y'_1$, $Z'_1$, the axis $X'_1$ being combined with the axis $X_1$. The two axes $Y'_1$, $Z'_1$, are obtained by rotating the axes $X_1$, $Y_1$, respectively, around the axis $X_1$ by an angle of rotation $\theta 1$.

Figure 4:
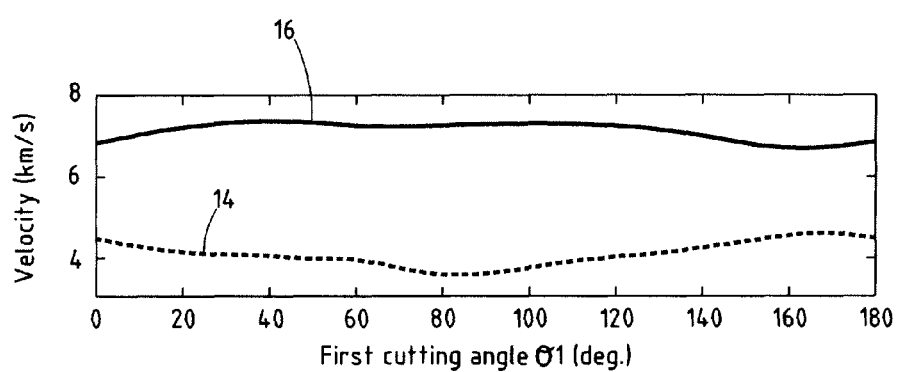

FIG. 4 shows the evolution of the phase velocity of the longitudinal and shear waves for single rotation cuts around the crystallographic axis $X_{11}$ of the transducer 6.

Curve 14 shows the phase velocity of the shear waves spreading in the transducer 6 along the normal axis at the planes of the electrodes 4 and 8, as a function of the first cutting angle $\theta 1$ expressed in degrees.

The curve 16 represents the phase velocity of the longitudinal waves, expressed in km/s, spreading in the transducer 6 along the axis of the length 1 as a function of the first angle $\theta 1$, expressed in degrees.

Figure 5:
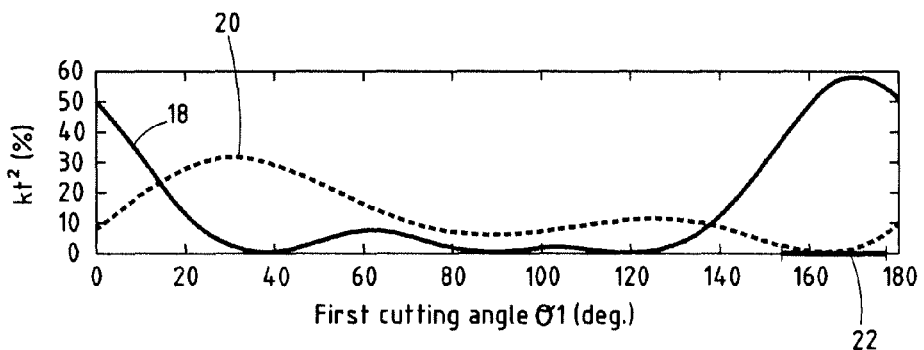

FIG. 5 shows the coupling of the longitudinal and shear waves for simple rotation cuts around the crystallographic axis $X_1$ of the transducer 6.

Curve 18 shows the evolution of the coupling coefficient $K^2_T$ expressed as a percentage of electrical energy converted into acoustic energy for shear waves as a function of the first cutting angle $\theta 1$ expressed in degrees.

Curve 20 shows the evolution of the coupling coefficient $K^2_T$ expressed as a percentage of electrical energy converted into acoustic energy for longitudinal waves as a function of the first cutting angle $\theta 1$ expressed in degrees.

FIG. 5 shows that curves 18 and 20 have an angular zone 22 in which the longitudinal wave is practically not coupled by piezoelectricity and consequently not electrically excited. The excitation of the shear wave is particularly effective, with an electromechanical coupling shown by $K^2_T$ between 50 and 60%.

The angular zone 22 is centered around the angle $\theta 1$ equal to 163° and with an amplitude equal to 10°.

Figure 6:
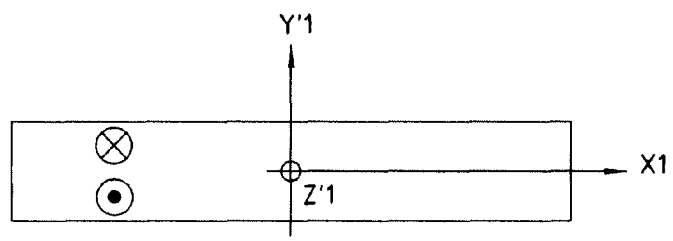

The cutting angle $\theta 1$ of the transducer described in FIG. 1 is chosen in zone 22 of FIG. 6 equal to 163°.

For simple rotation cuts of lithium niobate, only the mode corresponding to the fast shear wave has electromechanical coupling by piezoelectricity. Considering the planar illustration provided in FIG. 6 of the plate of the transducer 6 along the planar axes $X'_1$, $Y'_1$, it is shown that the shearing mode excited by piezoelectricity has a scalar polarization along the axis $Z'_1$ shown from the end in FIG. 6, i.e. normal to the plane $(X'_1, Y'_1)$, but whereof the spatial dependence is described by a function of the spatial coordinates according to the excitation plane. The polarization vector $\vec{P}_A$ is collinear to the axis $Z'_1$.

Figure 7:
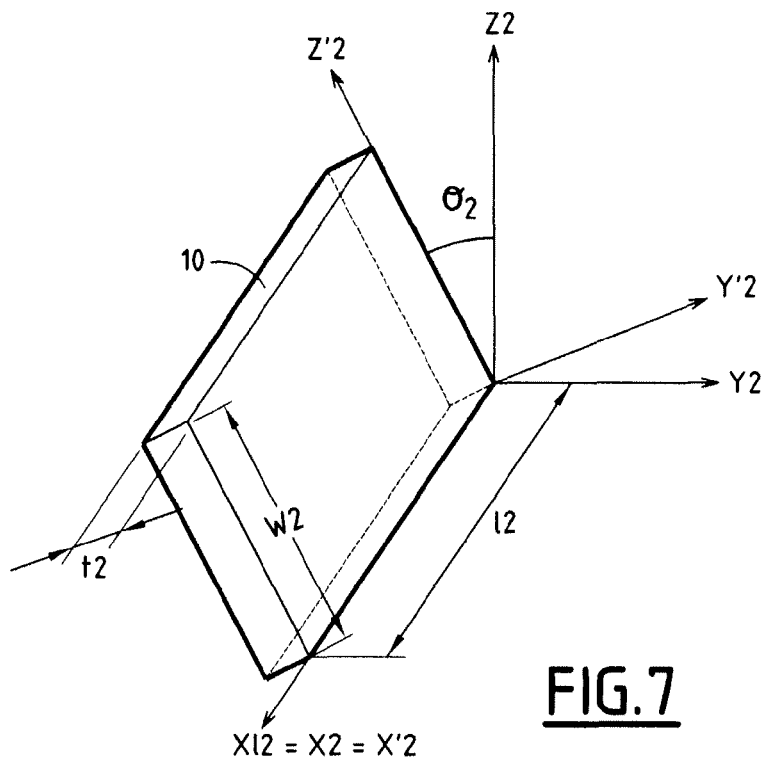

According to FIG. 7, the quartz plate 10 is cut out according to a second cutting angle $\theta 2$ from the raw monocrystal of the wafer not illustrated but referenced by the crystallographic axes of the quartz $X_2$, $Y_2$, $Z_2$, the axis $Z_2$ being the optical axis C revealed during the growth of a crystal gem.

The angle $\theta 2$ here is also that defined in the IEEE Std-176 (1949 revision) standard as the angle $\theta 2$ of a single rotation cut around the crystallographic axis $X_2$, the cut being noted $(Y_2, X_{12})/\theta 2$ in the IEEE Std-176 standard, $X_{12}$ being the axis aligned on the straight lower edge with thickness $t_2$ with length $L_2$ according to the illustration of FIG. 4.

The reference related to the cut out quartz plate 10 is illustrated by the three axes $X'_2$, $Y'_2$, $Z'_2$, the axis $X'_2$ being combined with the axis $X_2$. The two axes $Y'_2$, $Z'_2$ are obtained by rotating the axes $Y_2$, $Z_2$, respectively, around the axis $X_2$ by the angle of rotation $\theta 2$.

Figure 8:
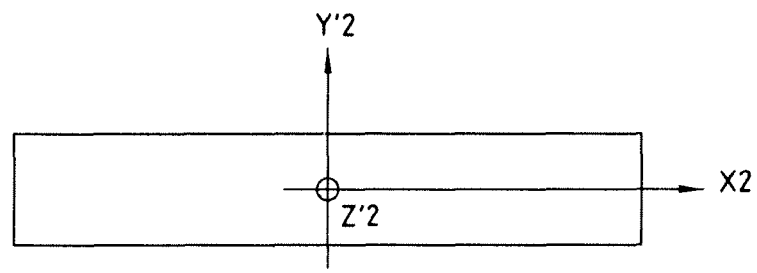

Considering the planar illustration along the axes $X'_2$, $Y'_2$ provided in FIG. 8 of the quartz plate 10, similar to the planar illustration provided for the transducer 6 in FIG. 6, it is possible to describe the polarization of the shearing mode one wishes to exploit in the quartz that has cuts for which the temperature sensitivities of the first wave are close to zero without changing signs. The shearing of the quartz is also scalar, but is established along the axis $X'_2$ and depends on the local coordinates connected to the plate according to the excitation plane. For single rotation lithium niobate or tantalate plates noted (YX1/$\theta$) according to the IEEE standard notation 1949 revision (IEEE standard on piezoelectricity Std 176-1949, Proc. of the IRE, vol. 37, pages 1378-1395, 1949), the chosen shear waves therefore have polarizations that are orthogonal to each other and only couple if the alignments of the crystallographic axes of the transducer 6 and acoustic substrate are suitably chosen. These polarizations must be taken into account during assembly of the materials of the transducer and the acoustic substrate to allow coupling of the acoustic waves one wishes to excite in the acoustic propagation substrate 10, here the quartz.

Here, this acoustic coupling effect is obtained by aligning the axis $Z'_1$ of the transducer 6 on the axis $X'_2$ of the acoustic substrate 10, or equivalently by aligning the axis $X'_1$ of the transducer 6 on the axis $Z'_2$ of the acoustic substrate 10, such that the polarization $\vec{P}_A$ is identical to those of shearing modes in the acoustic substrate 10 illustrated by $\vec{P}_{B1}$ making it possible to offset the thermal drift of the phase velocity of the corresponding waves.

Figure 9:
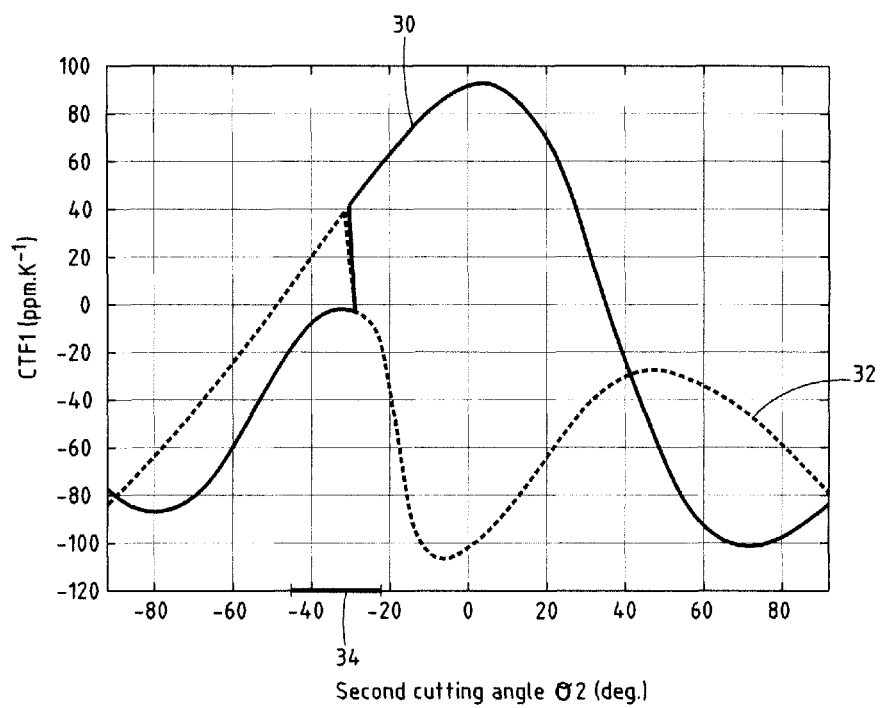

FIG. 9 illustrates the sensitivity of the shearing modes of the quartz to the static thermal effects in the form of two temperature coefficients of the frequency of the first order CTFB1 and CTFB2 for a plane-plane acoustic substrate 10 similar to that of FIG. 1 expressed in ppm·$K^{-1}$ (parts per million of the frequency per Kelvin), as a function of the second cutting angle θ2 expressed in degrees.

A first curve 30 in solid lines illustrates the evolution of a first temperature coefficient of the frequency of the first order CTFB1 for the so-called slow shear waves coupled by piezoelectricity as a function of the second cutting angle θ2, their polarization corresponding to the vector $\vec{P}_B$, oriented along the axis X'$_2$ when the value of the second cutting angle θ2 is between −90 and −24 degrees, and oriented along the axis Z'$_2$, when θ2 is between −24 and +90 degrees.

A second curve 32 in dotted lines illustrates the evolution of a second temperature coefficient of the frequency of the first order CTFB2 for the so-called fast shear waves not coupled by piezoelectricity as a function of the second cutting angle θ2, their polarization corresponding to the vector $\vec{P}_{B2}$ oriented along the axis Z'$_2$ when the value of the second cutting angle θ2 is between −90 and −24 degrees, and oriented along the axis X'$_2$ when θ2 is between −24 and +90 degrees.

The so-called fast or fast mode shear waves and the so-called slow or slow mode shear waves are defined as shear waves with orthogonal polarization, the so-called fast waves having a greater phase velocity than the so-called slow waves.

In the case of quartz, in the vicinity of the cutting angle θ2 equal to −24 degrees, the slow and fast modes trade polarizations. The modes remain orthogonal, but the fast shearing mode replaces the slow shearing mode for cuts with angle θ2 between −24 and −90 degrees. This phenomenon is visible in FIG. 9, where the coefficients of the two modes evolve abruptly in the vicinity of θ2 equal to −24 degrees.

This has the consequence that the illustration of FIG. 1 corresponds to a cutting angle θ2 of less than −24 degrees, and the vector polarization $\vec{P}_{B1}$ corresponds to a slow shear with axis X$_2$.

In the case where the cutting angle θ2 is greater than −24 degrees, the polarization vectors $\vec{P}_{B1}$ and $\vec{P}_{B2}$ of FIG. 1 are swapped and the plate of the transducer, i.e. the polarization vector $\vec{P}_A$ of the excitation wave of the transducer, should be rotated 90 degrees, so as to align the vector $\vec{P}_A$ on the slow shear polarization vector $\vec{P}_{B1}$, if one wishes to work at a constant shearing mode.

The curve 30 shows the existence of an angular zone 34 in which the first temperature coefficient of the frequency of the first order CTFB1 for the slow shear waves is close to zero and approaches it slightly. The angular zone 34 is centered around −35 degrees and has an amplitude of 22 degrees thereby guaranteeing a first temperature coefficient of the frequency of the first order CTFB1 with an absolute value of less than 20 ppm·K$^{-1}$.

The first cutting angle θ1 of the transducer of FIG. 1 is chosen in the zone 22 and the second angle θ2 of the acoustic substrate is chosen in the zone 34.

Thus, a HBAR resonator structure can be formed in which the geometric dimensions of the transducer are defined such that the resonator resonates at a desired tuning frequency with additional electrical characteristics resulting from operating requirements of an application.

The additional electrical characteristics are for example the spectral separation between two resonance modes defined as the spectral zone around the resonance mode lacking other resonances, the efficiency of the electromechanical coupling of the selected resonance mode, the characteristic impedance of the resonance, the quality coefficient at the resonance and the thermal stability of the resonance mode.

The spectral separation makes it possible to define the total thickness of the stack of layers of the HBAR resonator since the spectral separation corresponds to the frequency of the fundamental mode of the assembly formed by the transducer and the acoustic substrate including the embedded electrode.

The thicknesses of each layer of the HBAR resonator formed by different materials are adjusted so as to obtain a mode at the desired resonance or tuning frequency.

The thickness of the piezoelectric transducer is also determined taking into account the desired electromechanical coupling. The coupling is maximum when the selected mode is close to the fundamental mode of the resonance in the piezoelectric transducer alone.

The ratio of the transducer/acoustic substrate thicknesses is adjusted as a function of the desired thermal stability and the quality coefficient of the targeted resonance, knowing that to reliably achieve the performance of the quality parameter at the resonance, it is necessary to know well the viscoelastic constants of the materials used or other physical coefficients with complex values representative of physical properties such as, for example, the dielectric constants. The imaginary parts of these constants are often determined heuristically or by adjusting parameters of predictive models.

The impedance at the resonance depends on the electromechanical coupling of the selected mode and the value of the electrode surfaces facing it. For a given impedance, for example 50 ohms, the weaker the electromagnetic coupling of the selected mode, the bigger the facing surfaces of the electrodes.

The typical electrode surfaces are between a few hundred μm$^2$ and several mm$^2$ for stacking thicknesses from a mm to several μm.

The coupling of the electroacoustic vibrations of the transducer 6 on the fast mode ones of the acoustic substrate 10 is done through the counter-electrode 8, which acts as an acoustic short circuit in the bandpass of the transducer 6.

The acoustic substrate 10 thus slaves the resonance modes of the transducer 6 on its own resonance modes and thereby grants great temperature stability to the resonance modes of the transducer 6, which, left free, would drift considerably. Indeed, the temperature coefficients of the frequency of the first order of the HBAR piezoelectric transducers have high values, greater than 80 ppm·K$^{-1}$ for lithium niobate and 40 ppm·K$^{-1}$ for lithium tantalate in absolute values.

The temperature stability of the resonance modes of the transducer 6 thus slaved is that corresponding to the value of the temperature coefficient of the frequency CTFB1 selected through the second cutting angle θ2 and the alignment of the polarization vectors $\vec{P}_A$, $\vec{P}_{B1}$ corresponding respectively to the shearing mode of the transducer 6 and the slow shearing mode of the quartz 10 for thickness ratios Re of the transduction and acoustic propagation mediums of less than 5%, for example a ratio of 2.5 μm of lithium niobate on 50 μm of quartz, and modes of the structure of the HBAR resonator not corresponding to the fundamental or the odd harmonics of the resonance of the transduction layer alone.

In the configuration described above, on first approximation the lowest attainable value of the temperature coefficient of the frequency of the first order of the HBAR resonator is equal to −2 ppm·K$^{-1}$. It corresponds to a quartz cut (Y$_2$, X$_{12}$)/−32° or +/−5° around −32°. The precision of the calculated attainable value is equal to +/−2 ppm·K$^{-1}$ given the uncertainty of the physical constants used to calculate the dimensions of the HBAR resonator.

More precisely, the lowest attainable approximate value of the temperature coefficient of the frequency of the first order of the HBAR resonator must be corrected by an additional corrective term that represents the contribution of the transduction zone and depends on the order of the resonance mode and the ratio of the transducer/acoustic substrate thicknesses. This corrective term is written α·n with n the whole number designating the order of the resonance mode and a coefficient α depending on the ratio of the thicknesses Re equal to $-3\cdot10^{-7}$, $-1$, $5\cdot10^{-7}$, $-3$, $75\cdot10^{-8}$, $-1$, $875\cdot10^{-8}$, respectively, for a ratio of the thicknesses Re equal to 5%, 2%, 1%, 0.5%. Once the resonance mode is achieved corresponding to the optimum coupling (a half-wavelength in the transduction layer), this variation law of the corrective term is not valid.

Figure 10:
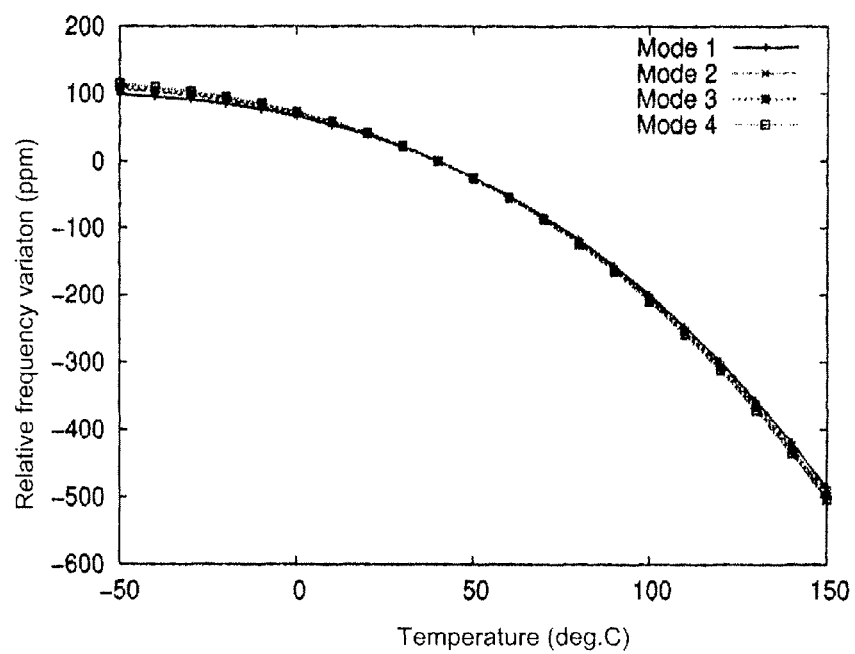
FIG. 10 is a graph of typical temperature stability performance in the bandpass of the resonator of FIG. 1 according to the invention.

FIG. 10 represents the temperature stability performance of a HBAR resonator according to the invention.

This figure illustrates the notion of inversion temperature Tinv of the temperature coefficient of the frequency of the first order of a resonator, here of the HBAR type. The inversion temperature Tinv is the temperature at which the first temperature coefficient of the frequency of the first order cancels itself out and changes signs.

FIG. 10 illustrates, for four harmonic orders of resonance modes, the evolution of the relative frequency variation expressed in ppm (parts per million) as a function of the temperature of a HBAR resonator formed by a lithium niobate transducer with cutting angle θ1 equal to +163 degrees and a thickness of 1 μm and a quartz acoustic substrate with a cutting angle θ2 equal to −32 degrees and with a thickness of 50 μm.

The evolution is substantially identical for the four resonance orders and the drift of the evolution curve corresponding to the temperature coefficient of the frequency of the first order of the resonator cancels itself out for a temperature Tinv equal to −50° C. In practice, the temperature coefficient of the frequency of the first order of the HBAR resonator with a base of lithium niobate on quartz is equal to $-2$ ppm·K-1 for an inversion temperature of about −50° C.

The temperature coefficient of the frequency of the second order of the resonator is here equal to $-16$ ppb·K$^{-2}$ and is obtained from the classic formula:

$$T_{inv} = T_{ref} - \frac{CTF1}{2*CTF2}$$

where $T_{inv}$ designates the inversion temperature, $T_{ref}$ designates the reference temperature, here equal to +50° C. according to FIG. 10, CTF1 designates the temperature coefficient of the frequency of the first order of the resonator, CTF2 designates the temperature coefficient of the frequency of the second order of the HBAR resonator.

The value of the CTF2 of the HBAR resonator obtained is low compared to the effects of the second order usually measured on quartz alone for a cut compensated by thermal effects of the first order, generally greater than 16 ppb·K$^{-2}$.

The nominal operating temperature of the HBAR resonator can be adjusted without difficulty in the temperature range from −50° C. to −273° C.

Figure 11:
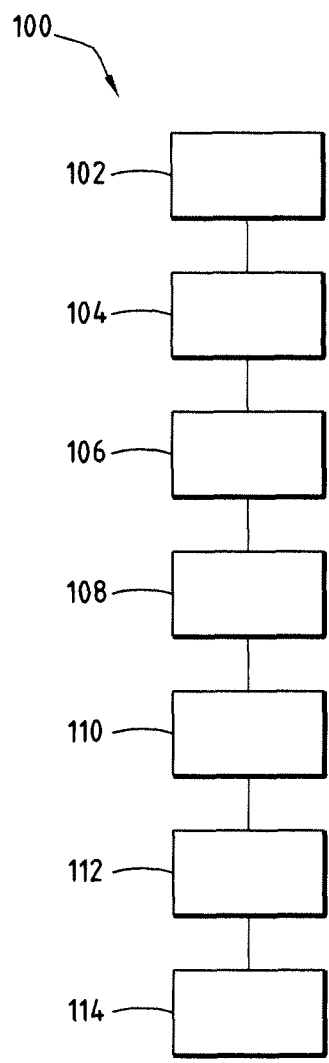
FIG. 11 is a flowchart of an embodiment of the manufacturing method of the resonator described in FIG. 2.

FIG. 11 illustrates a flowchart of a method 100 for manufacturing a resonator 2 of FIG. 1 according to the invention.

In a first step 102, a piezoelectric transducer 6 is provided formed by a layer of a first thickness of a first material oriented along an angle ϕ defined by the nomenclature (YXw)/ϕ of the IEEE Std-176 (1949 revision) standard equal to zero and cut along a first cutting angle θ1 defined by the nomenclature (YX1)/θ of the IEEE Std-176 (1949 revision) standard, such that the electroacoustic coupling of the shear waves is greater than 5%, the transducer 6 having a temperature coefficient of the frequency CTFA as a function of the first cutting angle θ1.

The material of the transducer 6 is included in the group of materials made up of aluminum nitride (AlN), zinc oxide (ZnO), lithium niobate (LiNbO$_3$), lithium tantalate (LiTaO$_3$) and potassium niobate.

Preferably, a material among lithium niobate (LiNbO3) and lithium tantalate (LiTaO$_3$) will be chosen due to an easier mastery of the method for manufacturing a monocrystal with a significant thickness.

Lithium niobate and tantalate can be manufactured by wafer with 4" diameter according to thickness standards of 500 μm and 350 μm.

In a second step 104, an acoustic substrate 10 is provided made up of a layer of a second thickness of a second material having a working frequency acoustic quality coefficient product at least equal to $5.10^{12}$, oriented along an angle ϕ defined by the nomenclature (YXw)/ϕ of the IEEE Std-176 (1949 revision) standard equal to zero, cut along a second cutting angle θ2 defined by the nomenclature (YX1)/θ of the IEEE Std-176 (1949 revision) standard, having a polarization direction $\vec{P}_{B1}$ corresponding to a first shearing mode of vibration, the acoustic substrate 10 having a temperature coefficient of the frequency of the first order CTFB1 corresponding to the at least one shearing mode and depending on the second cutting angle θ2.

In step 104 for providing a substrate 10, the second cutting angle θ2 of the substrate 10 is chosen such that the temperature coefficient of the frequency of the corresponding first order CTFB1 is a local extremum with an absolute value of less than 20 ppm·K$^{-1}$ and the variation of CTFB1 around this value of θ2 is a slight variation with an absolute value of less than 2 ppm·K$^{-1}$/degree.

The material of the acoustic substrate is included in the group of materials made up of quartz and isomorphous substitutes for example of the GeO$_2$ and TeO$_2$ type, gallium orthophosphate (GaPO$_4$) also with an isomorphous structure, potassium niobate, lithium tetraborate (LiB4O$_7$), langasite (La$_3$Ga$_5$SiO$_{14}$), langatate, langanite and their different variations.

Preferably, the material of the acoustic substrate is quartz due to its remarkable temperature stability properties and its complete knowledge in the crystallography field.

In a following step 106, one face of the transducer 6 and one face of the acoustic substrate 10 are metalized according to a thickness between 100 to 200 nm by a thermo-compressible or cold compressible material, for example gold, copper or indium, in order to adhere the two faces and thereby form a counter-electrode.

Gold is a particularly good material for this type of adhesion, given its plastic properties and its mechanical robustness sufficient to ensure an acoustic connection between the transducer 6 and the acoustic substrate 10.

In assembly step 108, the transducer 6 and the acoustic substrate 10 are arranged such that the polarization direction $\vec{P}_A$ of the shearing mode of the transducer 6 and the polarization direction $\vec{P}_{B1}$ of the at least one shearing mode of the substrate 10 corresponding to the second cutting angle θ2 are aligned.

In a following step 110, the adhesion is done by compression with or without temperature elevation depending on the metal used.

In the case where gold is used, the heating phase is eliminated and a long-lasting pressing is implemented to the benefit of the facing surface qualities and the ductility of the metal material to ensure the adhesion.

Thus, several lithium niobate/quartz composite slices were able to be produced in this way without flaws by simply keeping a temperature of 30° C. during the 16 hours of application of a pressure of 3000 Newtons.

Next in step 112, the slice of the resonator is burned in and polished.

Then in step 114, an electrode is metalized on a face of the transducer 6 opposite the substrate.

The method is easy to implement, in particular owing to a wide range of values of the second cutting angle θ2 making it possible to obtain good temperature stability performance.

Moreover, the resonators obtained using this method can operate up to frequencies of 20 GHz. The resonators are light and not bulky, offering a high level of integration.

Such a resonator can for example be integrated into a homodyne oscillator or in cells of a high reject filter.

Of course, other applications can be considered.

What is claimed is:

1. A resonator of the high bulk acoustic resonator type for operating at a predetermined working frequency, comprising:
    a piezoelectric transducer (6) formed by a layer with a first thickness of a first material oriented along an angle φ defined by the nomenclature (YXw)/φ of the IEEE Std-176 (1949 revision) standard equal to zero, cut along a first cutting angle θ1 defined by the nomenclature (YX1)/θ of the IEEE Std-176 (1949 revision) standard, such that the electroacoustic coupling of the shear waves within that material alone is greater than 5%, the transducer (6) having a temperature coefficient of the frequency CTFA as a function of the first cutting angle θ1,
    an acoustic substrate (10) formed by a second layer with a second thickness of a second material having a working frequency acoustic quality coefficient product at least equal to $5.10^{12}$, oriented along an angle φ defined by the nomenclature (YXw)/φ of the IEEE Std-176 (1949 revision) standard equal to zero, cut along a second cutting angle θ2 defined by the nomenclature (YX1)/θ of the IEEE Std-176 (1949 revision) standard, having at least one polarization direction $\vec{P}_{B1}$ corresponding to a first shearing mode of vibration, the acoustic substrate (10) having a temperature coefficient of the frequency of the first order CTFB1 corresponding to the at least one shearing mode and depending on the second cutting angle θ2,
    a counter-electrode (8) formed by a layer of metal adhering to a first face of the transducer (6) and a face of the acoustic substrate (10), and
    an electrode (4) arranged on a second face of the transducer (6) facing away from the first face of the transducer (6) and the substrate (10),
    characterized in that
    the relative arrangement of the transducer (6) and the substrate (10) is such that the direction of polarization $\vec{P}_A$ of the shearing mode of the transducer (6) and the polarization direction $\vec{P}_{B1}$ of the at least one shearing mode of the substrate (10) corresponding to the second cutting angle θ2 are aligned, and
    the second cutting angle θ2 of the substrate (10) is such that the temperature coefficient of the frequency of the corresponding first order CTFB1 is a local extremum with an absolute value of less than 20 ppm·K$^{-1}$ and the variation of CTFB1 around that value of θ2 is slight with an absolute value of less than 2 ppm·K$^{-1}$/degree.

2. The HBAR type resonator according to claim 1, characterized in that the temperature coefficient of the frequency of the first order CTF1 of the resonator is substantially equal to the temperature coefficient of the frequency of the first order CTFB1 for HBAR resonator modes not corresponding to the fundamental or the odd harmonics of the resonance of the transducer alone when the ratio Re of the first thickness over the second thickness is less than 5%.

3. The HBAR type resonator according to claim 1, characterized in that the value of the temperature coefficient of the frequency of the first order CTF1 of the resonator is equal to the temperature coefficient of the frequency of the first order CTFB1 corrected by an additional corrective term for HBAR resonator modes not corresponding to the fundamental or to the odd harmonics of the resonance of the transducer alone when the ratio Re of the first thickness over the second thickness is less than 5%, the corrective term being written α·n with n the whole number designating the harmonic order of the resonance mode of the resonator and α a coefficient depending on the ratio of the thicknesses Re with decreasing absolute values as a function of Re.

4. The HBAR type resonator according to claim 1, characterized in that the material of the transducer is included in the group of materials made up of aluminum nitride (AlN), zinc oxide (ZnO), lithium niobate (LiNbO$_3$), lithium tantalate (LiTaO$_3$) and potassium niobate.

5. The HBAR type resonator according to claim 4, characterized in that the material of the transducer is preferably included in the group of materials made up of lithium niobate (LiNbO$_3$) and lithium tantalate (LiTaO$_3$).

6. The HBAR type resonator according to claim 1, characterized in that the material of the acoustic substrate is included in the group of materials made up of quartz, potassium niobate, gallium orthophosphate (GaPO$_4$), lithium tetraborate (LiB$_4$O$_7$), langasite (La$_3$Ga$_5$SiO$_{14}$), langatate and langanite.

7. The HBAR type resonator according to claim 6, characterized in that the material of the acoustic substrate (10) is quartz.

8. The HBAR type resonator according to claim 1, characterized in that the counter-electrode is a thermo-compressible metal.

9. The HBAR type resonator according to claim 1, characterized in that the counter-electrode is made of gold or copper or indium.

10. The HBAR type resonator according to claim 1, characterized in that the geometric dimensions of the resonator are adapted for a resonance frequency of a frequency band included in the frequency range from 50 MHz to 20 GHz.

11. The HBAR type resonator according to claim 1, characterized in that
    the material of the acoustic substrate is quartz,
    the second cutting angle θ2 of the substrate (10) is equal to −32 degrees, and
    the polarization direction $\vec{P}_{B1}$ corresponds to the slow shearing mode of the quartz for a value of θ2 equal to −32 degrees.

12. The HBAR type resonator according to claim 11, characterized in that the material of the transducer of potassium niobate and the coefficient α is equal to $-3.10^{-7}$, $-1,5.10^{-7}$, $-3,75.10^{-8}$, $-1,875.10^{-8}$, respectively, for a respective ratio of the thicknesses equal to 5%, 2%, 1%, 0.5%.

13. A method for manufacturing a HBAR resonator comprising the following steps:

providing (102) a piezoelectric transducer (6) made up of a layer of a first thickness of a first material oriented along an angle φ defined by the nomenclature (YXw)/φ of the IEEE Std-176 (1949 revision) standard equal to zero, cut along a first cutting angle θ1 defined by the nomenclature (YX1)/θ of the IEEE Std-176 (1949 revision) standard, such that the electroacoustic coupling of the shear waves within that material alone is greater than 5%, the transducer (6) having a temperature coefficient of the frequency CTFA as a function of the first cutting angle θ1, and providing (104) an acoustic substrate formed by a first layer with a second thickness of a second material having a working frequency acoustic quality coefficient product at least equal to $5 \cdot 10^{12}$, oriented along an angle φ defined by the nomenclature (YXw)/φ of the IEEE Std-176 (1949 revision) standard equal to zero, cut along a second cutting angle θ2 defined by the nomenclature (YX1)/θ of the IEEE Std-176 (1949 revision) standard, having a polarization direction $\vec{P}_{B1}$ corresponding to a first shearing mode of vibration, the acoustic substrate (10) having a temperature coefficient of the frequency of the first order CTFB1 corresponding to the at least one shearing mode and depending on the second cutting angle θ2, metalizing (106) one face of the substrate (10) and a first face of the transducer (6) using a thermo-compressible metal, assembling (108) the transducer (6) and the substrate (10), adhering, by compression (110), the respective faces of the substrate (10) and the transducer (6) metalized in the step (106), metalizing (114) an electrode (4) on a second face of the transducer (6), characterized in that during the assembly step (108), the transducer (6) is arranged in relation to the substrate (10) such that the relative arrangement of the transducer (6) and the substrate (10) is such that the polarization direction $\vec{P}_A$ of the shearing mode of the transducer (6) and the polarization direction $\vec{P}_{B1}$ of the at least one shearing mode of the substrate (10) corresponding to the second cutting angle θ2 are aligned, and in that in the step (104) for providing the substrate (10), the second cutting angle θ2 of the substrate (10) is chosen such that the temperature coefficient of the frequency of the first corresponding order CTFB1 is a local extremum with an absolute value of less than 20 ppm·K$^{-1}$ and the variation of CTFB1 from said value of θ2 is slight with an absolute value of less than 2 ppm·K$^{-1}$/degree.

14. A homodyne oscillator comprising a HBAR resonator defined according to claim 1.

15. A high reject filter comprising HBAR resonator-based cells as defined in claim 1.

* * * * *